(12) United States Patent
Kobayashi et al.

(10) Patent No.: US 12,094,939 B2
(45) Date of Patent: Sep. 17, 2024

(54) SEMICONDUCTOR DEVICE HAVING A GATE ELECTRODE, AN INTERLAYER INSULATING FILM AND A BARRIER METAL PROVIDED IN A TRENCH

(71) Applicant: FUJI ELECTRIC CO., LTD., Kawasaki (JP)

(72) Inventors: Yusuke Kobayashi, Tsukuba (JP); Naoyuki Ohse, Matsumoto (JP); Shinsuke Harada, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 372 days.

(21) Appl. No.: 15/993,671

(22) Filed: May 31, 2018

(65) Prior Publication Data

US 2018/0358445 A1 Dec. 13, 2018

(30) Foreign Application Priority Data

Jun. 9, 2017 (JP) .................................. 2017-114766

(51) Int. Cl.
| | |
|---|---|
| *H01L 29/78* | (2006.01) |
| *H01L 29/06* | (2006.01) |
| *H01L 29/08* | (2006.01) |
| *H01L 29/10* | (2006.01) |
| *H01L 29/16* | (2006.01) |
| *H01L 29/417* | (2006.01) |
| *H01L 29/45* | (2006.01) |

(Continued)

(52) U.S. Cl.
CPC .... *H01L 29/41741* (2013.01); *H01L 29/0623* (2013.01); *H01L 29/063* (2013.01); *H01L 29/0869* (2013.01); *H01L 29/0878* (2013.01); *H01L 29/1095* (2013.01); *H01L 29/1608* (2013.01); *H01L 29/45* (2013.01); *H01L 29/66068* (2013.01); *H01L 29/7397* (2013.01); *H01L 29/7813* (2013.01)

(58) Field of Classification Search
CPC .................................................. H01L 29/7813
See application file for complete search history.

(56) References Cited

U.S. PATENT DOCUMENTS

| | | | | |
|---|---|---|---|---|
| 7,989,293 | B2 * | 8/2011 | Blanchard | ............. H01L 29/456 438/270 |
| 2009/0212359 | A1 * | 8/2009 | Hsieh | .................. H01L 29/1095 257/331 |
| 2009/0236612 | A1 | 9/2009 | Nakamura et al. | |

(Continued)

FOREIGN PATENT DOCUMENTS

| | | |
|---|---|---|
| JP | 2008-306095 A | 12/2008 |
| JP | 2009231545 A | 10/2009 |

(Continued)

*Primary Examiner* — Anh D Mai
(74) *Attorney, Agent, or Firm* — Rabin & Berdo, P.C.

(57) ABSTRACT

At a front surface of a silicon carbide base, an n−-type drift layer, a p-type base layer, a first n+-type source region, a second n+-type source region, and a trench that penetrates the first and the second n+-type source regions and the p-type base layer and reaches the n-type region are provided. In the trench, the gate electrode is provided via a gate insulating film, an interlayer insulating film is provided in the trench on the gate electrode, and a barrier metal is provided in the trench on the interlayer insulating film.

7 Claims, 14 Drawing Sheets

(51) Int. Cl.
  *H01L 29/66*  (2006.01)
  *H01L 29/739*  (2006.01)

(56) References Cited

U.S. PATENT DOCUMENTS

| | | |
|---|---|---|
| 2011/0024831 A1 | 2/2011 | Nakano |
| 2011/0079844 A1* | 4/2011 | Hsieh .............. H01L 21/823437 |
| | | 257/334 |
| 2011/0169075 A1 | 7/2011 | Hsieh |
| 2012/0146090 A1* | 6/2012 | Lui .................... H01L 29/0834 |
| | | 257/139 |
| 2014/0141585 A1 | 5/2014 | Nakamura et al. |
| 2016/0247910 A1* | 8/2016 | Suzuki .............. H01L 29/66068 |
| 2016/0359026 A1 | 12/2016 | Matsuura |
| 2017/0084699 A1* | 3/2017 | Hoshi ................. H01L 29/1608 |
| 2017/0352730 A1* | 12/2017 | Nakamura .......... H01L 29/0615 |
| 2019/0109227 A1* | 4/2019 | Kobayashi ........ H01L 29/42368 |

FOREIGN PATENT DOCUMENTS

| | | |
|---|---|---|
| JP | 2009-260253 A | 11/2009 |
| JP | 2016-040844 A | 3/2016 |
| JP | 2016225566 A | 12/2016 |

* cited by examiner

X-X'

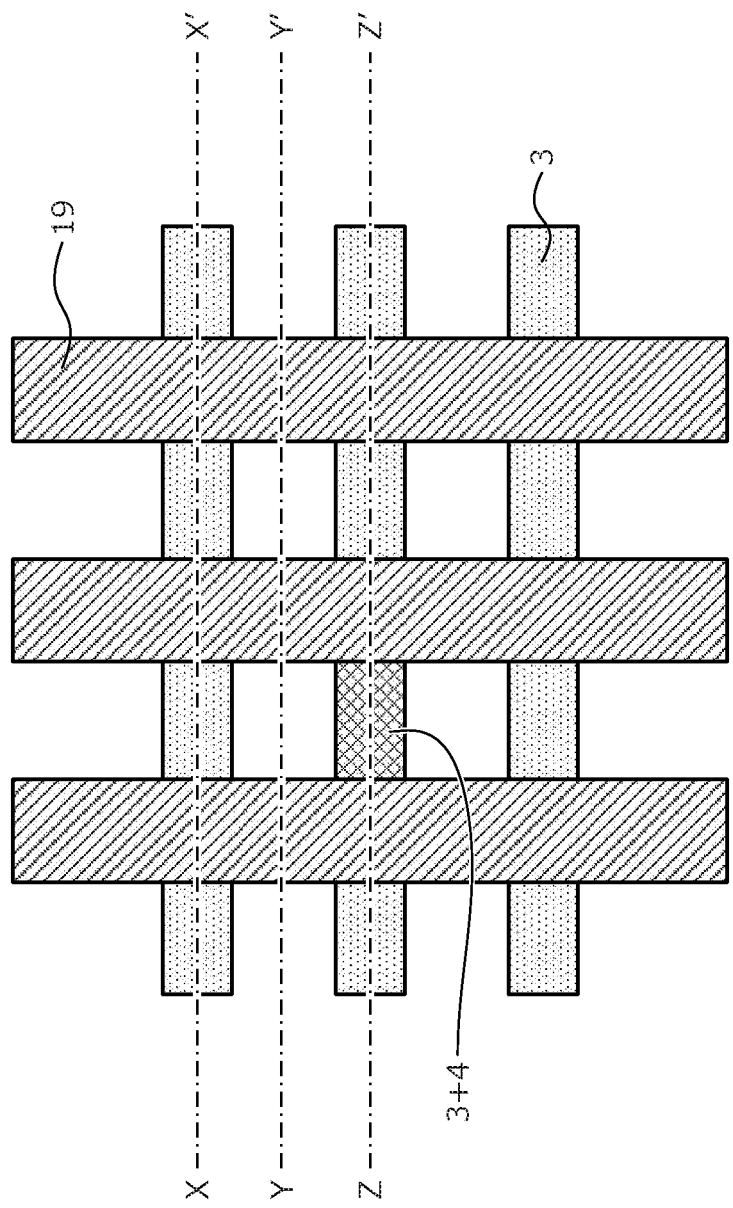

SEMICONDUCTOR DEVICE HAVING A GATE ELECTRODE, AN INTERLAYER INSULATING FILM AND A BARRIER METAL PROVIDED IN A TRENCH

CROSS REFERENCE TO RELATED APPLICATIONS

This application is based upon and claims the benefit of priority of the prior Japanese Patent Application No. 2017-114766, filed on Jun. 9, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, in a power semiconductor element, to facilitate reductions in element ON resistance, a vertical metal oxide semiconductor field effect transistor (MOSFET) having a trench structure is fabricated (manufactured). In the vertical MOSFET, a trench structure formed orthogonally to a surface of a substrate enables the cell density per unit area to be increased to a greater extent than does a planar structure in which a channel is formed parallel to the surface of the substrate and therefore, the former enables the current density per unit area to be increased and is advantageous from an aspect of cost.

Nonetheless, when a trench structure is formed in a vertical MOSFET, the structure is such that inner walls of the trench are covered entirely by a gate insulating film to form the channel in a vertical direction and a portion of the gate insulating film at a bottom of the trench is near a drain electrode, whereby high electric field tends to be applied to the portion of the gate insulating film at the bottom of the trench. In particular, with a wide bandgap semiconductor material (semiconductor material having a bandgap that is wider than that of silicon, e.g., silicon carbide (SiC)), an ultra-high voltage element is fabricated and therefore, adverse effects on the gate insulating film at the bottom of the trench significantly reduce reliability.

According to a technique proposed as a method to solve such problems, in a vertical MOSFET with a trench structure having a striped planar pattern, a p$^+$-type base region is provided between trenches, in a striped shape parallel to the trenches (for example, refer to Japanese Laid-Open Patent Publication No. 2009-260253). According to another proposed technique, a p$^+$-type base region is provided at the bottom of the trench, in a striped shape parallel to the trench.

FIG. 12 is a cross-sectional view of a structure of a conventional silicon carbide semiconductor device. The conventional silicon carbide semiconductor device depicted in FIG. 12 includes at a front surface (surface on a p-type base layer 1016 side) side of a semiconductor base (hereinafter, silicon carbide base) 200 containing silicon carbide, a MOS gate having a typical gate structure. The silicon carbide base (semiconductor chip) 200 is formed by sequentially forming by epitaxial growth on an n$^+$-type supporting substrate (hereinafter, n$^+$-type silicon carbide substrate) 102 containing silicon carbide, silicon carbide layers constituting an n$^-$-type drift layer 101, an n-type region 1015 that is a current diffusion region, and the p-type base layer 1016.

In the n-type region 1015, a first p$^+$-type region 103 is selectively formed so as to entirely cover a bottom of a trench 1030. The first p$^+$-type region 103 is provided at a depth not reaching the n$^-$-type drift layer 101. Reference numerals 1017, 1018, 1019, 1020, 1021, 1022, 1025, and 1028 are a first n$^+$-type source region, a p$^+$-type contact region, gate insulating film, a gate electrode, an interlayer insulating film, a source electrode pad, a barrier metal, and a source electrode, respectively.

In a vertical MOSFET having the structure depicted in FIG. 12, a pn junction of the first p$^+$-type region 103 and the n-type region 1015 is positioned deeper than the trench 1030. Therefore, electric field concentrates at a boundary of the first p$^+$-type region 103 and the n-type region 1015, enabling electric field concentration at the bottom part of the trench 1030 to be mitigated.

According to one technique, in a trench-type vertical MOSFET, a gate electrode and an interlayer insulating film are embedded in the trench, a top surface of the trench is planarized and at the top surface of the trench, the interlayer insulating film and a source contact region are made to be equal heights (for example, refer to Japanese Laid-Open Patent Publication No. 2016-040844, Japanese Laid-Open Patent Publication No. 2008-306095).

SUMMARY OF THE INVENTION

According to an embodiment of the present invention, a semiconductor device includes a semiconductor substrate of a first semiconductor type; a first semiconductor layer of the first semiconductor type provided on a front surface of the semiconductor substrate; a second semiconductor layer of a second semiconductor type provided on a first side of the first semiconductor layer opposite a second side of the first semiconductor layer, the second side facing toward the semiconductor substrate; a first semiconductor region of the first semiconductor type selectively provided in second semiconductor layer, an impurity concentration of the first semiconductor region being higher than an impurity concentration of the semiconductor substrate; a trench penetrating the first semiconductor region and the second semiconductor layer, and reaching the first semiconductor layer; a gate electrode provided on the trench, via a gate insulating film; an interlayer insulating film provided on the gate electrode in the trench; a barrier metal provided on the interlayer insulating film in the trench; a first electrode in contact with the first semiconductor region, the second semiconductor layer, and the barrier metal; and a second electrode provided at a rear surface of the semiconductor substrate.

In the embodiment, the first semiconductor region is constituted by an upper first semiconductor region and a lower first semiconductor region having respectively differing impurity concentrations determining conductivity.

In the embodiment, the barrier metal contains TiN or Ti.

In the embodiment, a thickness of the interlayer insulating film is at least 0.3 μm.

In the embodiment, the semiconductor device further includes a second semiconductor region of the second semiconductor type selectively provided in the first semiconductor layer, the second semiconductor region being in contact with a bottom of the trench.

In the embodiment, the second semiconductor region has a striped shape parallel to a width direction of the trench.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is a top view of the structure of the silicon carbide semiconductor device according to the second embodiment, at cutting line a-a' in FIGS. 7A to 7C;

DETAILED DESCRIPTION OF THE INVENTION

Figure 12:
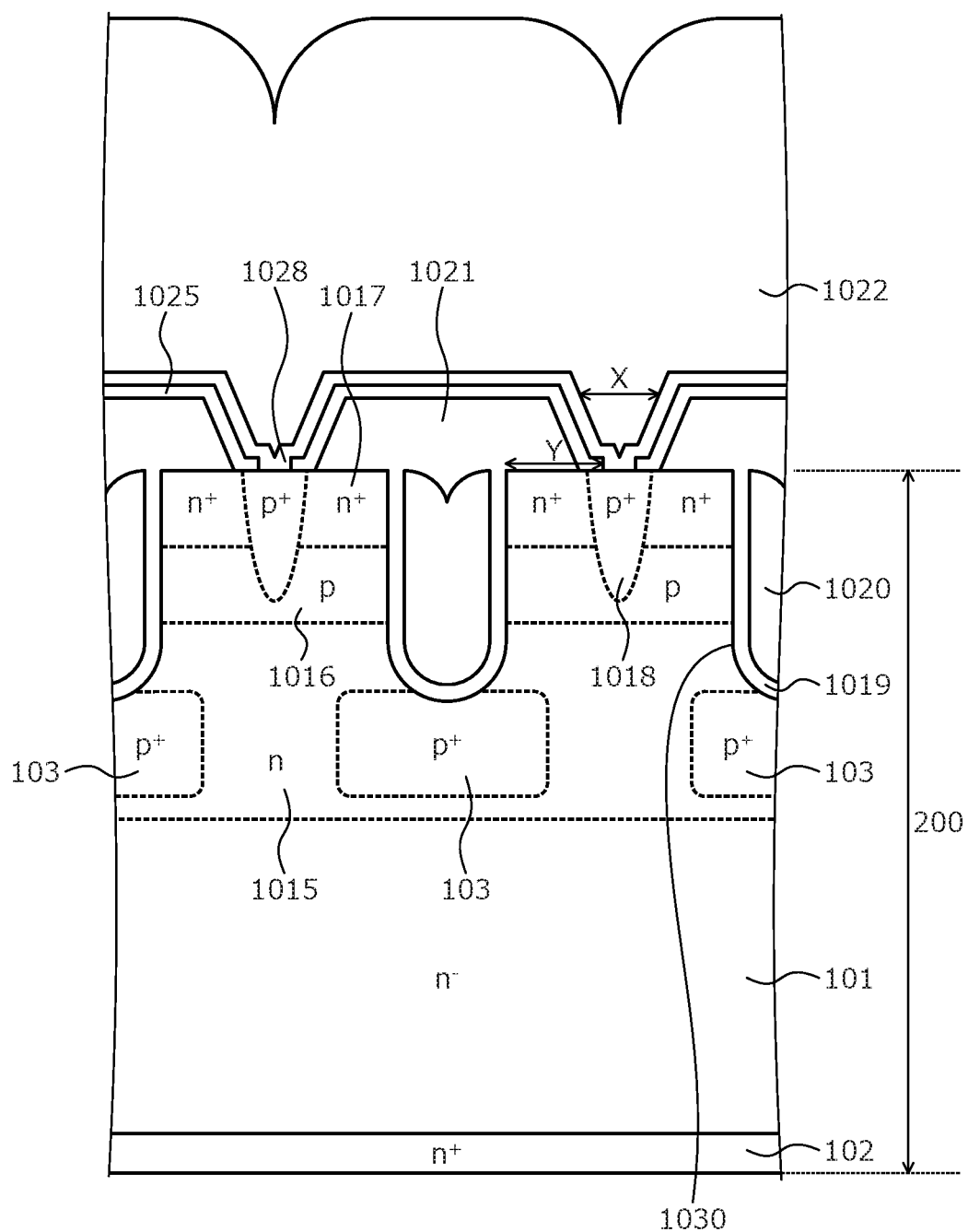
FIG. 12 is a cross-sectional view of a structure of a conventional silicon carbide semiconductor device.

First, problems associated with the related arts will be described. With the described conventional structure, making a cell pitch less than 4.0 μm is difficult. To reduce the cell pitch, a distance X between adjacent source electrodes 1028 depicted in FIG. 12 or a distance Y between a source electrode 1028 and the trench 1030 has to be reduced.

For example, when X is reduced, contact holes become narrower. Therefore, coverage for aluminum (Al) constituting the source electrode pad 1022 degrades and plating becomes difficult. Further, nickel silicide coverage of the source electrode 1028 degrades and contact resistance increases. Further, coverage for the barrier metal 1025 degrades and reliability decreases. While use of a tungsten (W) plug may circumvent these problems, W has high resistivity and therefore, ON resistance may increase.

On the other hand, when Y is decreased, a distance between the gate electrode 1020 and the source electrode 1028 decreases and therefore, Al and poly-silicon (Poly-Si) constituting the gate electrode 1020 have a higher risk of shorting. The poly-silicon and nickel silicide constituting the source electrode 1028 also have a higher risk of shorting. As a result, insulation between the gate electrode 1020 and the source electrode 1028 degrades, whereby yield of the semiconductor device may decrease.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
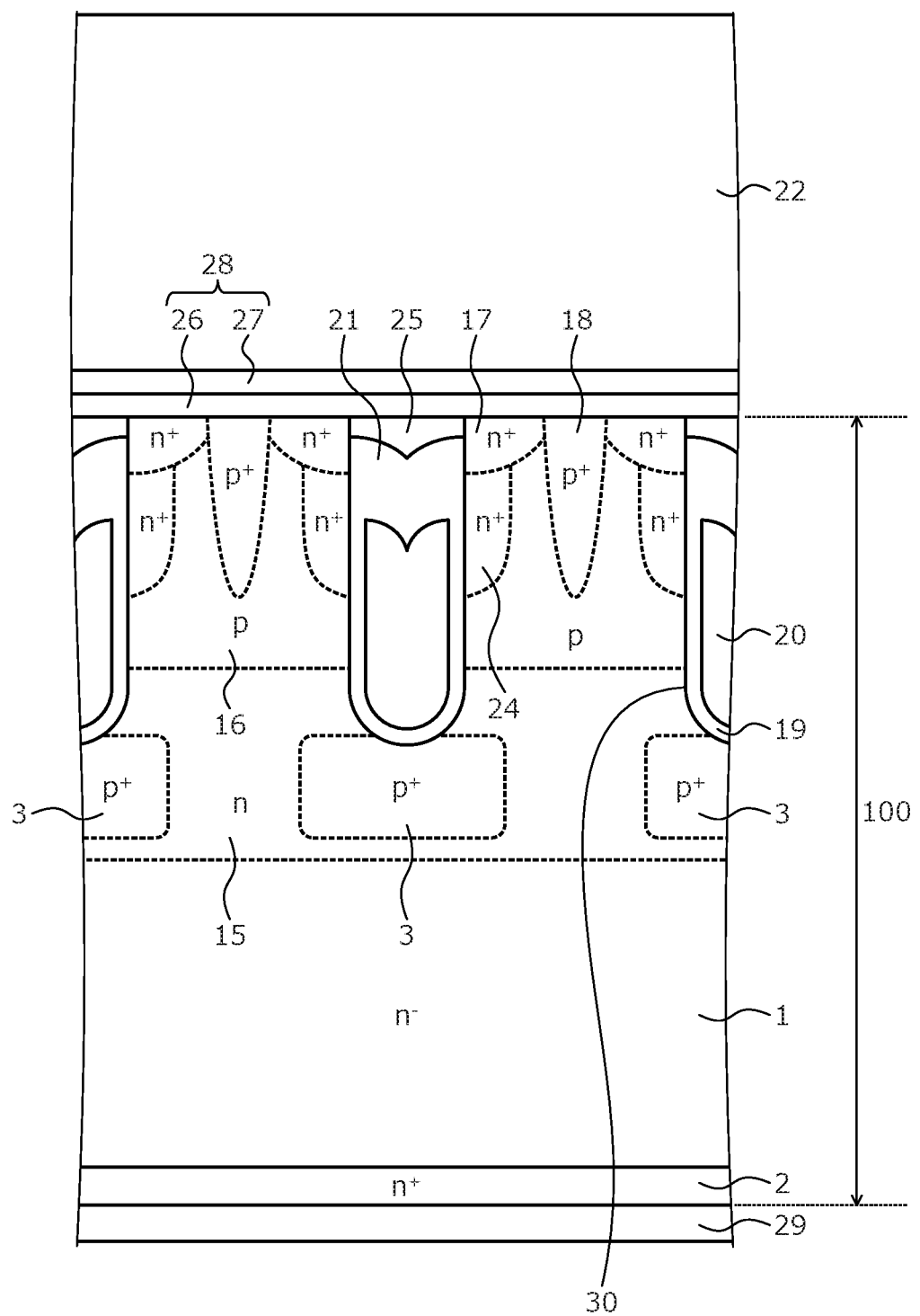
FIG. 1 is a cross-sectional view of a structure of a silicon carbide semiconductor device according to a first embodiment.

The semiconductor device according to embodiments of the present invention is configured using a semiconductor material (hereinafter, wide bandgap semiconductor material) that has a bandgap that is wider than a bandgap of silicon. Here, a structure of a semiconductor device (silicon carbide semiconductor device) that uses, for example, silicon carbide (SiC) as a wide bandgap semiconductor material will be described as an example. FIG. 1 is a cross-sectional view of a structure of the silicon carbide semiconductor device according to a first embodiment. In FIG. 1, only two unit cells (function units of an element) are depicted, while other unit cells adjacent to these two unit cells are not depicted (similarly in FIGS. 7A to 7C). The silicon carbide semiconductor device according to the first embodiment depicted in FIG. 1 is a MOSFET that includes a MOS gate at a front surface (surface on a p-type base layer 16 side) side of a semiconductor base (silicon carbide base: semiconductor chip) 100 that contains silicon carbide.

The silicon carbide base 100 is formed by sequentially forming by epitaxial growth on an $n^+$-type supporting substrate ($n^+$-type silicon carbide substrate: semiconductor substrate of a first semiconductor type) 2 containing silicon carbide, silicon carbide layers respectively constituting an $n^-$-type drift layer (first semiconductor layer of the first semiconductor type) 1 and a p-type base layer (second semiconductor layer of a second semiconductor type) 16. The MOS gate is constituted by the p-type base layer 16, a first $n^+$-type source region (first semiconductor region of the first semiconductor type) 17, a second $n^+$-type source region (first semiconductor region of the first semiconductor type) 24, a $p^+$-type contact region 18, a trench 30, a gate insulating film 19, and a gate electrode 20. In particular, in a surface layer on a source side (side toward a source electrode 28) of the $n^-$-type drift layer 1, an n-type region 15 is provided so as to be in contact with the p-type base layer 16. The n-type region 15 is a current diffusing layer, a so-call current spreading layer (CSL) that reduces carrier spreading resistance. The n-type region 15, for example, is provided uniformly along a direction (hereinafter, lateral direction) parallel to a base front surface (front surface of the silicon carbide base 100).

In the n-type region 15, a first $p^+$-type region 3 and a second $p^+$-type region 4 (not depicted) are selectively provided. The first $p^+$-type region 3 is provided so as to be in contact with a bottom surface of the trench 30 described hereinafter. The first $p^+$-type region 3 is provided from a position deeper toward a drain electrode 29 than is an interface of the p-type base layer 16 and the n-type region 15, to a depth not reaching an interface of the n-type region 15 and the $n^-$-type drift layer 1. Provision of the first $p^+$-type region 3 enables formation of a pn junction between the first $p^+$-type region 3 and the n-type region 15, near the bottom surface of the trench 30. The first $p^+$-type region 3 is doped with, for example, aluminum and has an impurity concentration that is higher than an impurity concentration of the p-type base layer 16.

Further, a width of the first $p^+$-type region 3 is equal to or wider than a width of the trench 30. Each first $p^+$-type region 3 may partially extend toward adjacent trenches 30, whereby the first $p^+$-type regions 3 are connected. With such a structure, holes generated at the time of avalanche breakdown at a junction of the first $p^+$-type region 3 and the n-type region 15 are efficiently migrated to the source electrode 28, whereby load on the gate insulating film 19 is reduced and reliability is increased.

Figure 4A:
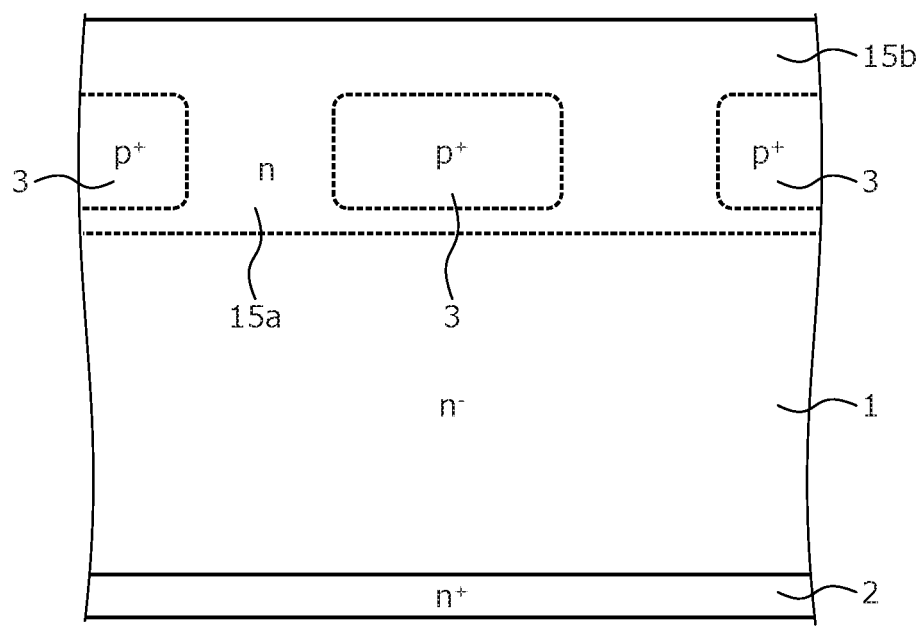
FIG. 4A is a cross-sectional view of the silicon carbide semiconductor device according to the first embodiment during manufacture.
Figure 4B:
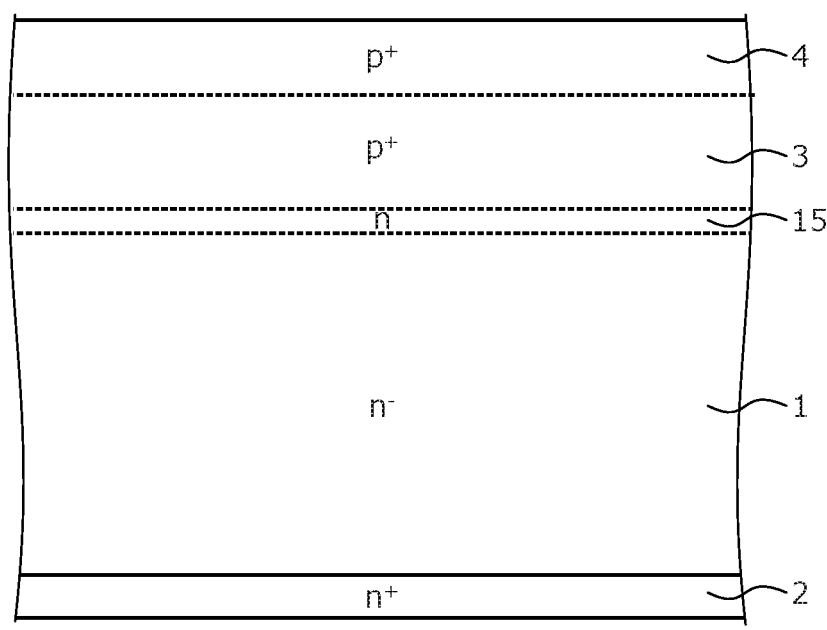
FIG. 4B is a cross-sectional view of the silicon carbide semiconductor device according to the first embodiment during manufacture.

The second $p^+$-type region 4 is partially provided in a surface layer of the n-type region 15, and a bottom of the second $p^+$-type region 4 is in contact with the first $p^+$-type region 3 (refer to FIG. 4B). Further, the second $p^+$-type region 4 is in contact with a side wall of the trench 30 (refer to FIG. 7C of a second embodiment). The second $p^+$-type region 4 is doped with, for example, aluminum and an impurity concentration of the second $p^+$-type region 4 is higher than the impurity concentration of the p-type base layer 16.

In the p-type base layer 16, an $n^+$-type source region and a $p^+$-type contact region 18 are selectively provided so as to be in contact with each other. The $n^+$-type source region is constituted by a first $n^+$-type source region 17 and a second $n^+$-type source region 24 in contact with each other. The first $n^+$-type source region 17 is provided in a surface layer of the p-type base layer 16. The second $n^+$-type source region 24 is provided at a position deeper toward the drain electrode 29 than is the first $n^+$-type source region 17, and a width of the second $n^+$-type source region 24 is narrower than a width of the first $n^+$-type source region 17. A depth of the $p^+$-type contact region 18 may be, for example, equal to or deeper than a depth of the second $n^+$-type source region 24.

The first $n^+$-type source region 17 has an impurity concentration that is lower than an impurity concentration of the second $n^+$-type source region 24, and has a type of impurity different from that of the second $n^+$-type source region 24. For example, the first $n^+$-type source region 17 is implanted with phosphorus (P) or arsenic (As), and the second $n^+$-type source region 24 is implanted with nitrogen ($N_2$). Provision of the first $n^+$-type source region 17 and the second $n^+$-type source region 24 enables a source region to be provided deeply, thereby enabling the trench 30 to be provided deeply.

The trench 30 penetrates the first $n^+$-type source region 17, the second $n^+$-type source region 24 and the p-type base layer 16 from the base front surface, and reaches the n-type region 15 and the first $p^+$-type region 3. In the trench 30, the gate insulating film 19 is provided along side walls of the trench 30, and the gate electrode 20 is provided on the gate insulating film 19. The gate electrode 20 is electrically connected at a non-depicted part to a gate pad (not depicted).

In the trench 30, at a position (closer to the source electrode 28 than is the gate electrode 20) farther from the drain electrode 29 than is the gate electrode 20, for example, an interlayer insulating film 21 containing silicon dioxide ($SiO_2$) is provided. A thickness of the interlayer insulating film 21 may be 0.3 μm or greater. Provision of the interlayer insulating film 21 having this thickness or greater enables the gate electrode 20 and the source electrode 28 to be insulated. Further, in the trench 30, at a position (closer to the source electrode 28 than is the interlayer insulating film 21) farther from the drain electrode 29 than is the interlayer insulating film 21, a barrier metal 25 is provided that prevents diffusion of metal atoms, for example, nickel (Ni), from the source electrode 28 toward the gate electrode 20. The barrier metal 25 is formed by, for example, titanium nitride (TiN), Ti, etc.

In the trench 30, the interlayer insulating film 21 and the barrier metal 25 are embedded, enabling the front surface of the silicon carbide base 100 to be planarized. At the entire front surface, an Ni film 26 and a Ti film 27 are provided in order stated. The Ni film 26 and the Ti film 27 constitute the source electrode (first electrode) 28, are in contact with the $n^+$-type source region 17 and the $p^+$-type contact region 18, and are electrically insulated from the gate electrode 20 by the interlayer insulating film 21. On the source electrode 28, the source electrode pad 22 containing, for example, Al—Si is provided. At a rear surface (rear surface of the $n^+$-type silicon carbide substrate 2 constituting an $n^+$-type drain region) of the silicon carbide base 100, the drain electrode 29 (second electrode) is provided.

A method of manufacturing the silicon carbide semiconductor device according to the first embodiment will be described. FIGS. 2, 3, 4, 5, and 6 are cross-sectional views of the silicon carbide semiconductor device according to the first embodiment during manufacture. First, the $n^+$-type silicon carbide substrate 2 constituting the $n^+$-type drain region is prepared. For example, as the $n^+$-type silicon carbide substrate 2, the $n^+$-type silicon carbide substrate 2 is prepared having an impurity concentration in a range from $1\times10^{18}$ to $1\times10^{20}/cm^3$ and a thickness in a range from 100 μm to 700 μm.

Figure 2:
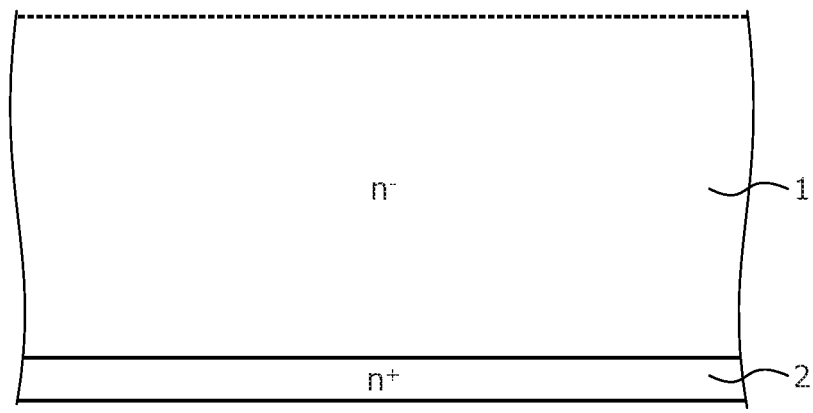
FIG. 2 is a cross-sectional view of the silicon carbide semiconductor device according to the first embodiment during manufacture.

Next, on a front surface of the $n^+$-type silicon carbide substrate 2, the $n^-$-type drift layer 1 is formed by epitaxial growth. For example, conditions of the epitaxial growth for forming the $n^-$-type drift layer 1 may be set so that an impurity concentration of the $n^-$-type drift layer 1 is in a range from $3\times10^{15}$ to $5\times10^{16}/cm^3$, and a film thickness of the $n^-$-type drift layer 1 in a range from about 5 μm to 40 μm. The state up to here is depicted in FIG. 2.

Next, by photolithography and ion implantation of a p-type impurity, for example, Al, the first $p^+$-type region 3 is selectively formed in a surface layer of the $n^-$-type drift layer 1. For example, a dose amount at the time of ion implantation for forming the first $p^+$-type region 3 may be set so that an impurity concentration thereof is in a range from $1\times10^{17}$ to $1\times10^{19}/cm^3$, and a depth of the first $p^+$-type region 3 is in a range from 0.1 μm to 1.0 μm, and a width of the first $p^+$-type region 3 is in a range from 0.5 μm to 2.0 μm.

Figure 3:
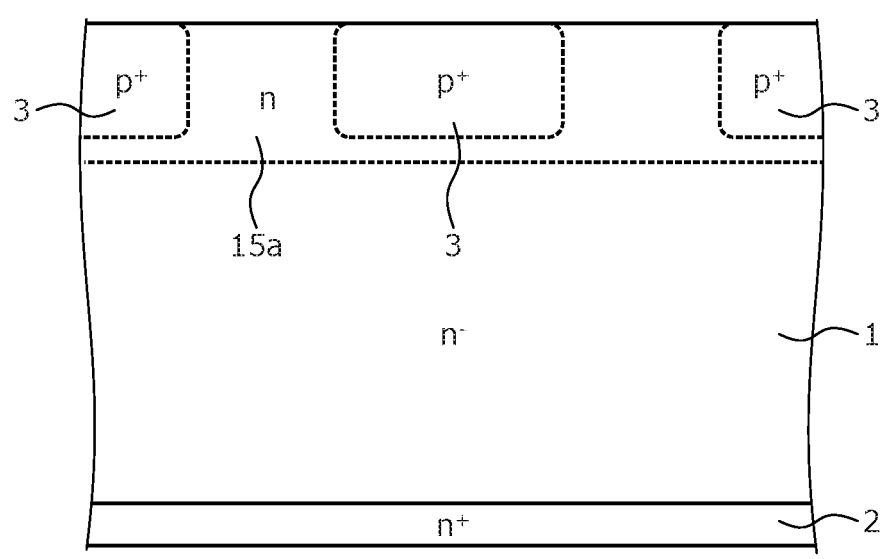
FIG. 3 is a cross-sectional view of the silicon carbide semiconductor device according to the first embodiment during manufacture.

Next, by photolithography and ion implantation of an n-type impurity, for example, $N_2$, a lower n-type region 15a is selectively formed in a surface layer of the $n^-$-type drift layer 1. The lower n-type region 15a is a part of the n-type region 15. For example, a dose amount at the time of ion implantation for forming the lower n-type region 15a may be set so that an impurity concentration of the lower n-type region 15a is in a range from $1\times10^{16}$ to $1\times10^{18}/cm^3$, and a depth of the lower n-type region 15a is in a range from 0.1 μm to 1.5 μm. The state up to here is depicted in FIG. 3.

Next, on the first p⁺-type region 3 and the lower n-type region 15a, an n-type region is formed by epitaxial growth. For example, conditions of the epitaxial growth for forming the n-type region may be set so that an impurity concentration of the n-type region is in a range from $3\times10^{16}$ to $5\times10^{16}/cm^3$, and a thickness of the n-type region is in a range from 0.3 μm to 0.6 μm. The n-type region is formed by ion implantation described hereinafter and constitutes a part of the n-type region 15.

Next, by photolithography and ion implantation of a p-type impurity, for example, Al, the second p⁺-type region 4 is selectively formed in a surface layer of the n-type region. For example, a dose amount at the time of ion implantation for forming the second p⁺-type region 4 may be set so that an impurity concentration of the second p⁺-type region 4 is in a range from $1\times10^{17}$ to $1\times10^{19}/cm^3$, a depth of the second p⁺-type region 4 is in a range from 0.1 μm to 1.0 μm, and a width of the second p⁺-type region 4 is in a range from 0.5 μm to 2.0 μm.

Next, by photolithography and ion implantation of an n-type impurity, for example, $N_2$, an upper n-type region 15b is selectively provided in the surface layer of the n-type region. For example, a dose amount at the time of ion implantation for forming the upper n-type region 15b may be set so that an impurity concentration of the upper n-type region 15b is in a range from $1\times10^{16}$ to $1\times10^{18}/cm^3$, and a depth of the upper n-type region 15b is in a range from 0.1 μm to 1.5 μm. The lower n-type region 15a and the upper n-type region 15b combined constitute the n-type region 15. The state up to here is depicted in FIGS. 4A and 4B. FIGS. 4A and 4B are cross-sectional views at differing positions at a same at manufacturing stage.

Next, on the second p⁺-type region 4 and the n-type region 15, the p-type base layer 16 is formed by epitaxial growth. For example, conditions of the epitaxial growth for forming the p-type base layer 16 may be set so that the impurity concentration of the p-type base layer 16 is in a range from $5\times10^{16}$ to $1\times10^{18}/cm^3$, and a thickness of the p-type base layer 16 is in a range from 0.7 μm to 2.1 μm.

Next, by photolithography and ion implantation of an n-type impurity, for example, $N_2$, the second n⁺-type source region 24 is selectively formed in the surface layer of the p-type base layer 16. For example, a dose amount at the time of ion implantation for forming the second n⁺-type source region 24 may be set so that an impurity concentration of the second n⁺-type source region 24 is in a range from $1\times10^{17}$ to $1\times10^{19}/cm^3$, a depth of the second n⁺-type source region 24 is in a range from 0.6 μm to 1.1 μm, and a width of the second n⁺-type source region 24 is in a range from 240.5 μm to 1.5 μm.

Next, by photolithography and ion implantation of an n-type impurity, for example, P, the first n⁺-type source region 17 is selectively formed in the surface layer of the p-type base layer 16. For example, a dose amount at the time of ion implantation for forming the first n⁺-type source region 17 may be set so that an impurity concentration of the first n⁺-type source region 17 is in a range from $1\times10^{18}$ to $1\times10^{20}/cm^3$, and a depth of the first n⁺-type source region 17 is in a range from 0.3 μm to 0.6 μm.

Figure 5:
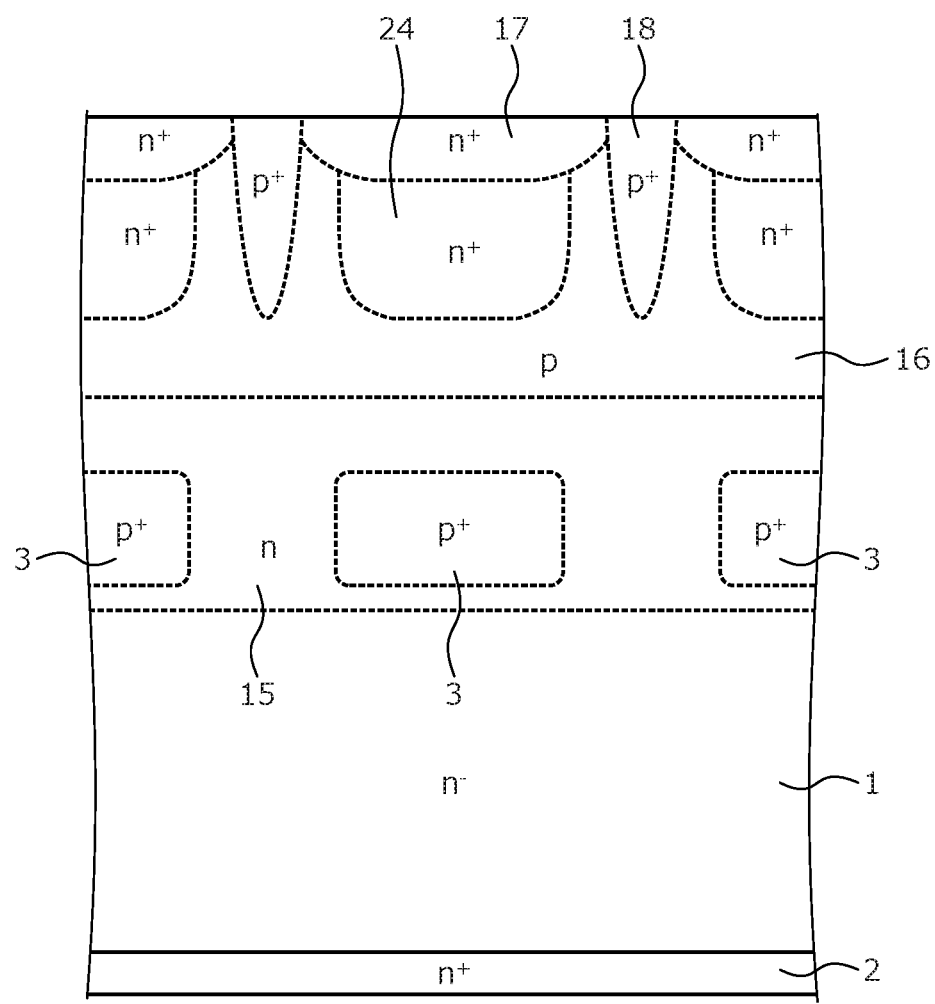
FIG. 5 is a cross-sectional view of the silicon carbide semiconductor device according to the first embodiment during manufacture.

Next, by photolithography and ion implantation of a p-type impurity, for example, Al, the p⁺-type contact region 18 is selectively formed in the surface layer of the p-type base layer 16. For example, a dose amount at the time of ion implantation for forming the p⁺-type contact region 18 may be set so that an impurity concentration of the p⁺-type contact region 18 is in a range from $1\times10^{18}$ to $1\times10^{20}/cm^2$, and a depth of the p⁺-type contact region 18 is in a range from 0.3 μm to 0.6 μm. The state up to here is depicted in FIG. 5.

Next, to reduce surface roughness of the silicon carbide base 100, a carbon coating layer called a carbon cap is formed on a surface of the silicon carbide base 100 and activation annealing is performed. Next, the carbon cap is removed and by photolithography and etching, the trench 30 is formed penetrating the first n⁺-type source region 17, the second n⁺-type source region 24 and the p-type base layer 16, and reaching the n-type region 15 and the first p⁺-type region 3. Further, after trench etching, isotropic etching for removing damage of the trenches 30 and hydrogen annealing for rounding the bottom part of the trenches 30 and openings of the trenches 30 may be performed. Either the isotropic etching or the hydrogen annealing may be performed. Alternatively, after the isotropic etching is performed, the hydrogen annealing may be performed.

Next, along an inner wall of the trench 30, the gate insulating film 19 is formed. The gate insulating film 19 may be formed by thermal oxidation by heat treatment in an oxygen atmosphere at a temperature of about 1200 degrees C. The gate insulating film 19 may be formed by a deposition method such as by a chemical reaction like that for a high temperature oxide (HTO). After formation of the gate insulating film 19, post oxidation annealing (POA) in an atmosphere containing hydrogen or water vapor may be performed. Next, for example, poly-silicon is deposited so as to be embedded in the trenches 30 and is etched, whereby the poly-silicon remains in the trenches 30, and forms the gate electrodes 20. At this time, etching is performed so that the poly-silicon remains deeper than the surface of the silicon carbide base 100.

Figure 6:
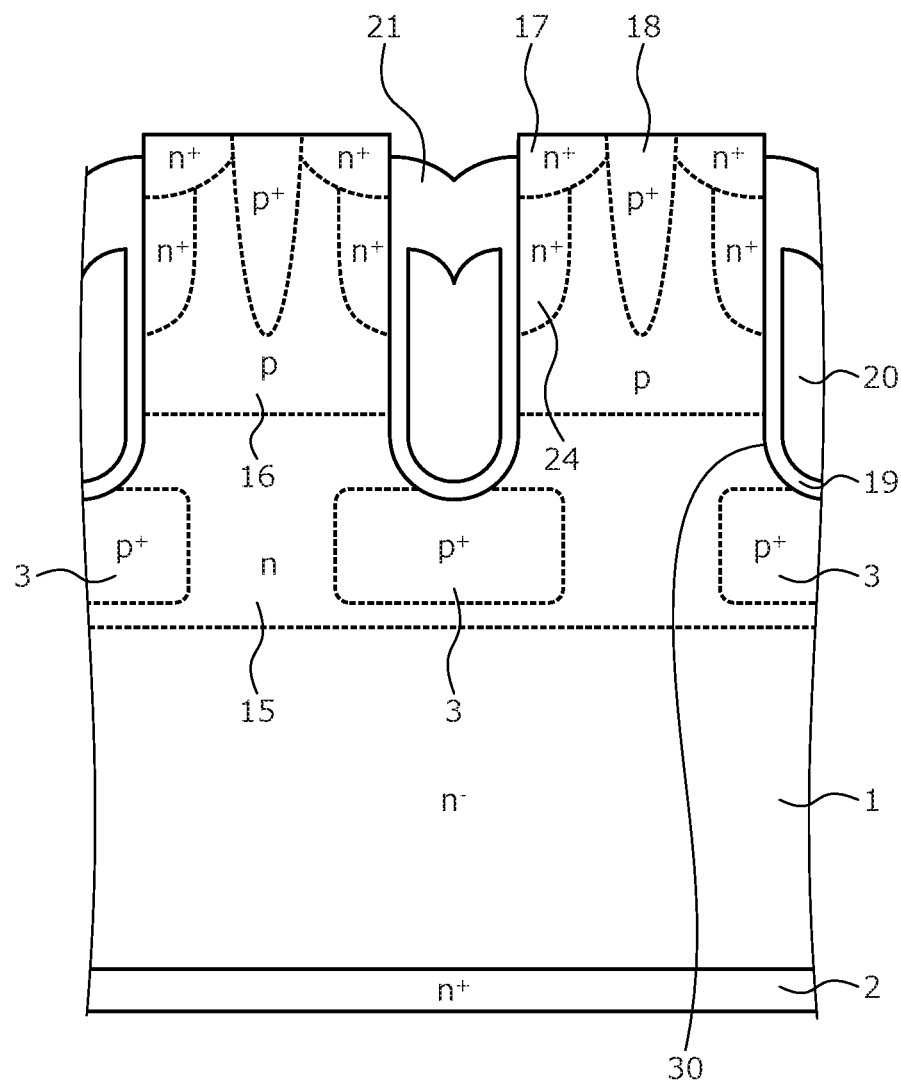
FIG. 6 is a cross-sectional view of the silicon carbide semiconductor device according to the first embodiment during manufacture.

Next, for example, $SiO_2$ is deposited and etched so as to be embedded on the poly-silicon in the trenches 30, whereby the $SiO_2$ is left forming the interlayer insulating film 21 in the trenches 30. At this time, etching may be performed so that the $SiO_2$ is left up to the surface of the silicon carbide base 100. Further, in place of etching, a chemical mechanical polishing (CMP) process may be used, or formation may be by etching by thickly stacking a resist. Next, the interlayer insulating film 21 is dry etched from the surface of the silicon carbide base 100, to a predetermined depth of, for example, within 0.1 μm. The state up to here is depicted in FIG. 6.

Next, as the barrier metal 25, for example, TiN is deposited so as to be embedded on the interlayer insulating film 21 in the trench 30 and by a CMP process, is left up to the surface of the silicon carbide base 100. Next, for example, by a sputtering method, the Ni film 26 is formed on the front surface side of the silicon carbide base 100. Next, for example, by sintering (heat treatment) at 800 degrees C. to 1000 degrees C., a silicon carbide semiconductor part (the first n⁺-type source region 17 and the p⁺-type contact region 18) and the Ni film 26 are caused to react and form a nickel silicide film, whereby an ohmic contact is formed with the silicon carbide semiconductor part.

Next, on the nickel silicide film, the Ti film 27 is formed as the source electrode, and the source electrode pad 22, which is an Al—Si film is formed. For example, the Ti film 27 is formed by a sputtering method, and the Al—Si film is formed by sputtering to a top of the Ti film 27.

Next, at the rear surface of the n$^+$-type silicon carbide substrate 2, by sputtering deposition at a contact part of the drain electrode 29, a metal film such as a nickel (Ni) film, a titanium (Ti) film, etc. is formed. The metal film may be constituted by a combination of multiple Ni and Ti films. Thereafter, annealing such as rapid thermal annealing (RTA) is performed to convert the metal film into a silicide and form an ohmic contact. Thereafter, for example, a thick film constituted by a Ti film, an Ni film, and a gold (Au) film sequentially stacked in order stated is formed by electron beam (EB) deposition, etc., whereby the drain electrode 29 is formed. In this manner, the MOSFET depicted in FIG. 1 is completed.

As described, according to the first embodiment, the gate electrode, the interlayer insulating film, and the barrier metal are embedded in the trench. As a result, a thickness of the interlayer insulating film may be adjusted by a length of the trench and even when the cell pitch is reduced, insulation of the gate electrode and the source electrode may be ensured. Therefore, decreases in semiconductor device yield due to degradation of insulation between the gate electrode and the source electrode may be resolved. Further, since the surface of the semiconductor base is flat, plating is facilitated and nickel silicide coverage also improves. Further, the mathematical area of contact between the first n$^+$-type source region and the nickel silicide increases and the contact resistance decreases. Therefore, even when the cell pitch is 4.0 μm or less, for example, 1.5 μm, the ON resistance does not increase and there is no need to use a tungsten plug.

Further, in the first embodiment, as the source region, the first n$^+$-type source region and the second n$^+$-type source region are provided and formed by ion implanting P or As in the first n$^+$-type source region, and implanting N$_2$ in the second n$^+$-type source region. As a result, the source region may be provided deeply, and the length of the trench may be increased. Therefore, the gate electrode, the interlayer insulating film, and the barrier metal may be embedded in the trench.

Figure 7A:
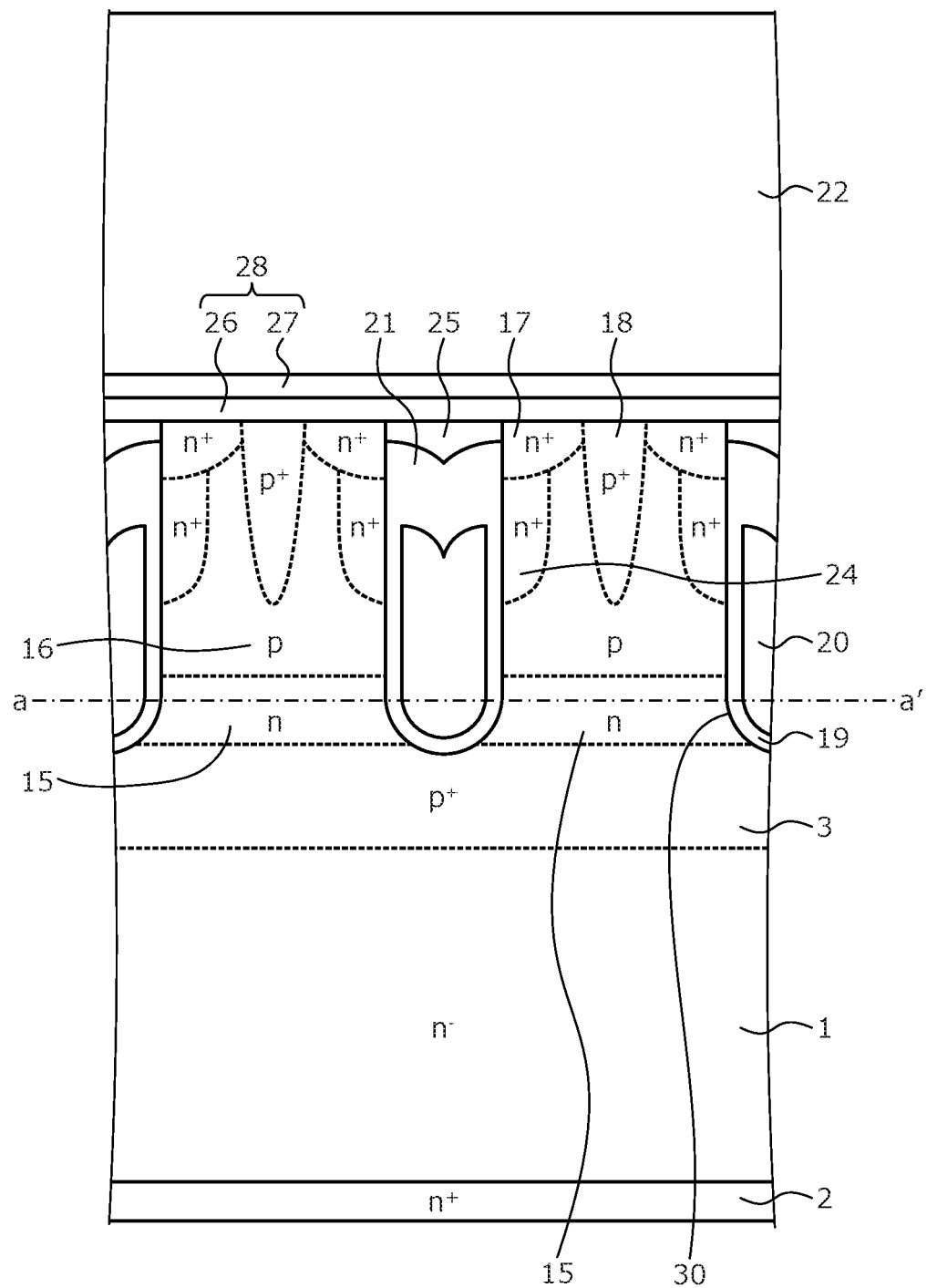
FIG. 7A is a cross-sectional view a structure of the silicon carbide semiconductor device according to a second embodiment, at cutting line X-X' in FIG. 8.
Figure 7B:
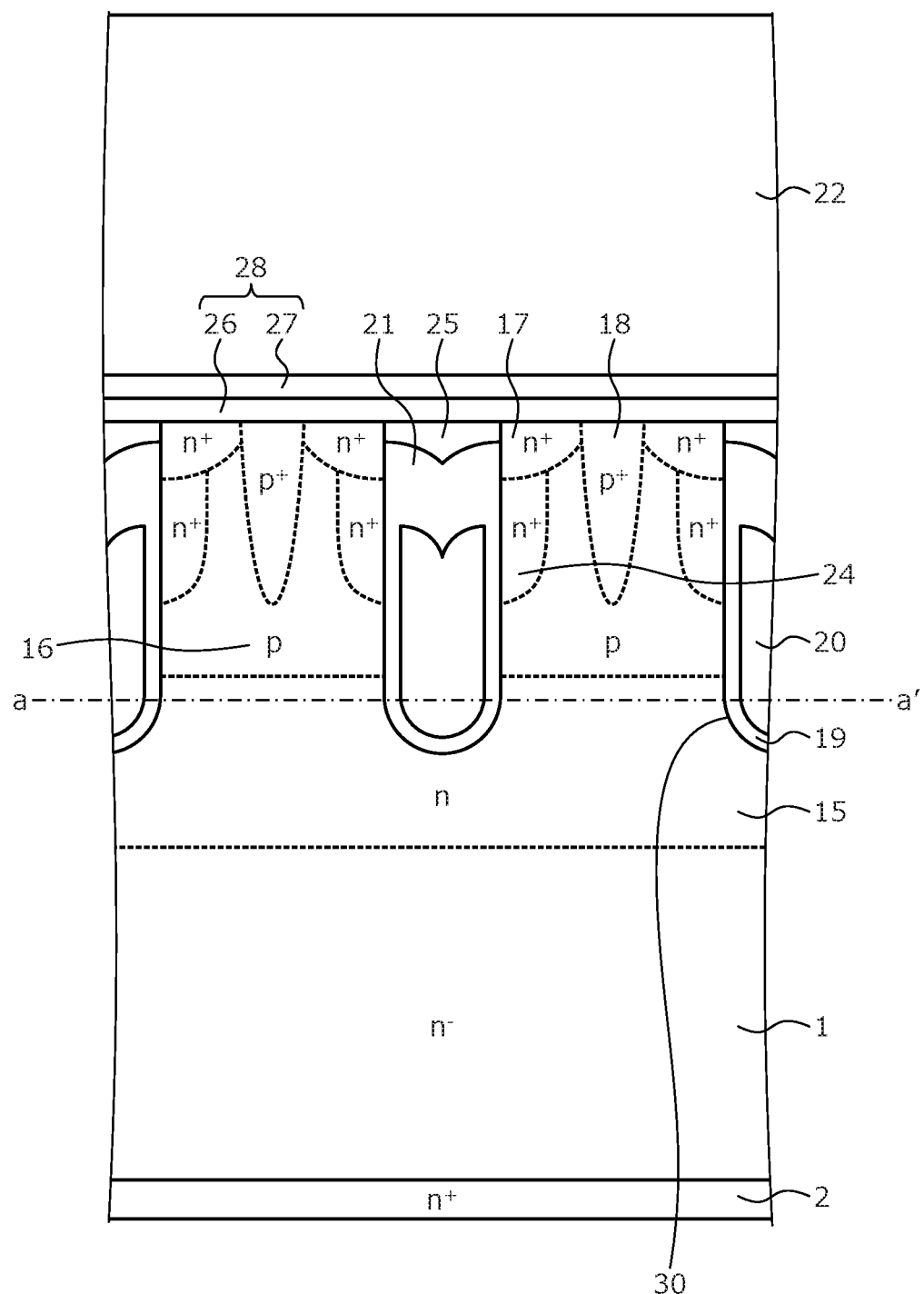
FIG. 7B is a cross-sectional view of the structure of the silicon carbide semiconductor device according to the second embodiment, at cutting line Y-Y' in FIG. 8.
Figure 7C:
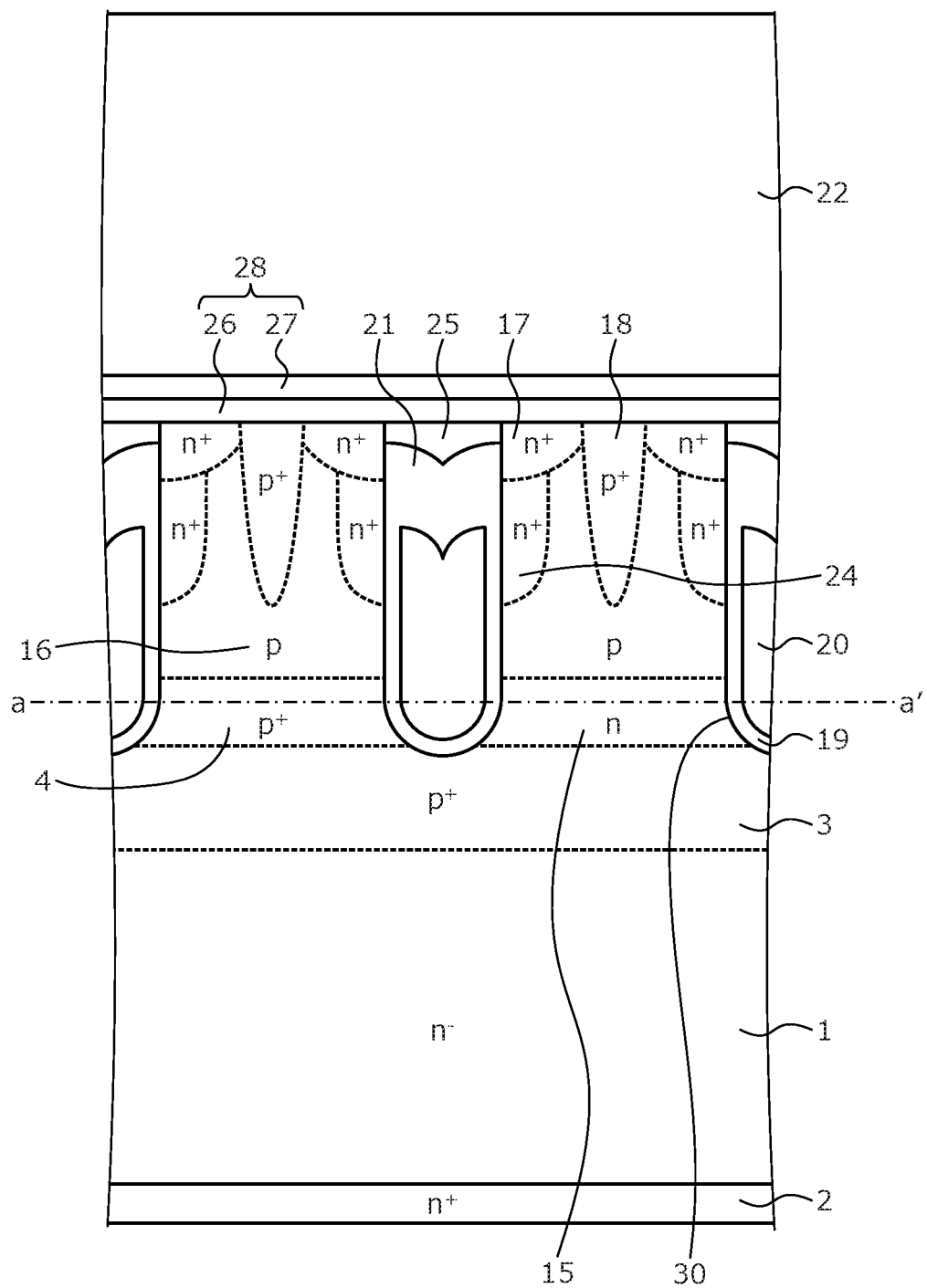
FIG. 7C is a cross-sectional view of the structure of the silicon carbide semiconductor device according to the second embodiment, at cutting line Z-Z' in FIG. 8.

A structure of the silicon carbide semiconductor device according to the second embodiment will be described. FIGS. 7A, 7B, and FIG. 7C are cross-sectional views of a structure of the silicon carbide semiconductor device according to the second embodiment. FIG. 8 is a top view of the structure of the silicon carbide semiconductor device according to the second embodiment, at cutting line a-a' in FIGS. 7A to 7C. Here, FIG. 7A is a cross-sectional view at cutting line X-X' in FIG. 8; FIG. 7B is a cross-sectional view at cutting line Y-Y' in FIG. 8; and FIG. 7C is a cross-sectional view at cutting line Z-Z' in FIG. 8.

The silicon carbide semiconductor device according to the second embodiment differs from the silicon carbide semiconductor device according to the first embodiment in that positions and shapes of the first p$^+$-type region 3 and the second p$^+$-type region 4 in the n-type region 15 differ from those in the first embodiment.

The first p$^+$-type region 3, as depicted in FIG. 7A, is provided to be in contact with the n$^-$-type drift layer 1 and the bottoms of the trenches 30. Further, as depicted in FIG. 8, the first p$^+$-type region 3 has a striped shape along a width direction of the trenches 30. Further, as depicted in FIG. 7C, the second p$^+$-type region 4 is selectively provided on an upper side (side toward the source electrode 28) of the first p$^+$-type region 3, between adjacent trenches 30. Provision of the first p$^+$-type region 3 in a striped shape along the width direction of the trenches 30 enables alignment deviations of the second p$^+$-type region 4 and the trench 30 with the first p$^+$-type region 3 to be prevented.

A method of manufacturing the silicon carbide semiconductor device according to the second embodiment will be described. FIGS. 9A, 9B, 10A, 10B, and 10C are cross-sectional views of the silicon carbide semiconductor device according to the second embodiment during manufacture. The method of manufacturing the silicon carbide semiconductor device according to the second embodiment, for example, differs from the method of manufacturing the silicon carbide semiconductor device according to the first embodiment in the method of forming the first p$^+$-type region 3 and the second p$^+$-type region 4. For example, first, similarly to the first embodiment, the processes of preparing the n$^+$-type silicon carbide substrate 2 to forming the n$^-$-type drift layer 1 by epitaxial growth are sequentially performed (refer to FIG. 2).

Next, on the n$^-$-type drift layer 1, the lower n-type region 15a is formed by epitaxial growth. For example, conditions of the epitaxial growth for forming the lower n-type region 15a may be set so that the impurity concentration of the lower n-type region 15a is in a range from $1\times10^{16}$ to $1\times10^{18}/cm^3$, and the thickness of the lower n-type region 15a is in a range from 0.1 μm to 1.5 μm.

Figure 9A:
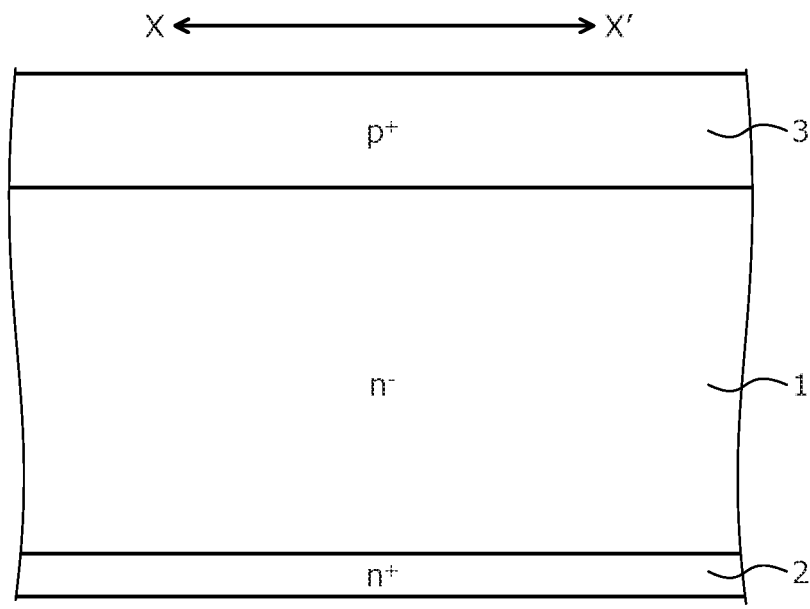
FIG. 9A is a cross-sectional view of the silicon carbide semiconductor device according to the second embodiment, at cutting line X-X' in FIG. 8 during manufacture.
Figure 9B:
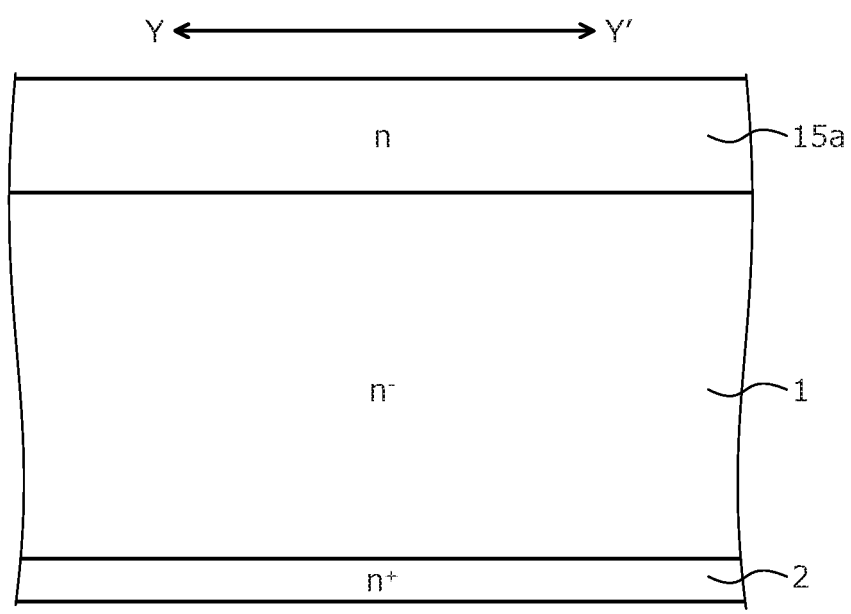
FIG. 9B is a cross-sectional view of the silicon carbide semiconductor device according to the second embodiment, at cutting line Y-Y' in FIG. 8 during manufacture.

Next, by photolithography and ion implantation of a p-type impurity, for example, Al, the first p$^+$-type region 3 having striped shaped is selectively formed in the surface layer of the lower n-type region 15a. For example, a dose amount at the time of ion implantation for forming the first p$^+$-type region 3 may be set so that the impurity concentration of the first p$^+$-type region 3 is in a range from $1\times10^{17}$ to $1\times10^{19}/cm^3$, the depth of the first p$^+$-type region 3 is in a range from 0.1 μm to 1.5 μm, and the width of the first p$^+$-type region 3 is in a range from 0.5 μm to 2.0 μm. The state up to here is depicted in FIGS. 9A and 9B. FIG. 9A is a cross-sectional view at cutting line X-X' in FIG. 8; and FIG. 9B is a cross-sectional view at cutting line Y-Y' in FIG. 8.

Next, on the lower n-type region 15a and the first p$^+$-type region 3, the upper n-type region 15b is formed by epitaxial growth. For example, conditions of the epitaxial growth for forming the upper n-type region 15b may be set so that the impurity concentration of the upper n-type region 15b is in a range from $1\times10^{16}$ to $1\times10^{18}/cm^3$, and a thickness of the upper n-type region 15b is in a range from 0.3 μm to 0.6 μm. The lower n-type region 15a and the upper n-type region 15b combined constitute the n-type region 15.

Figure 10A:
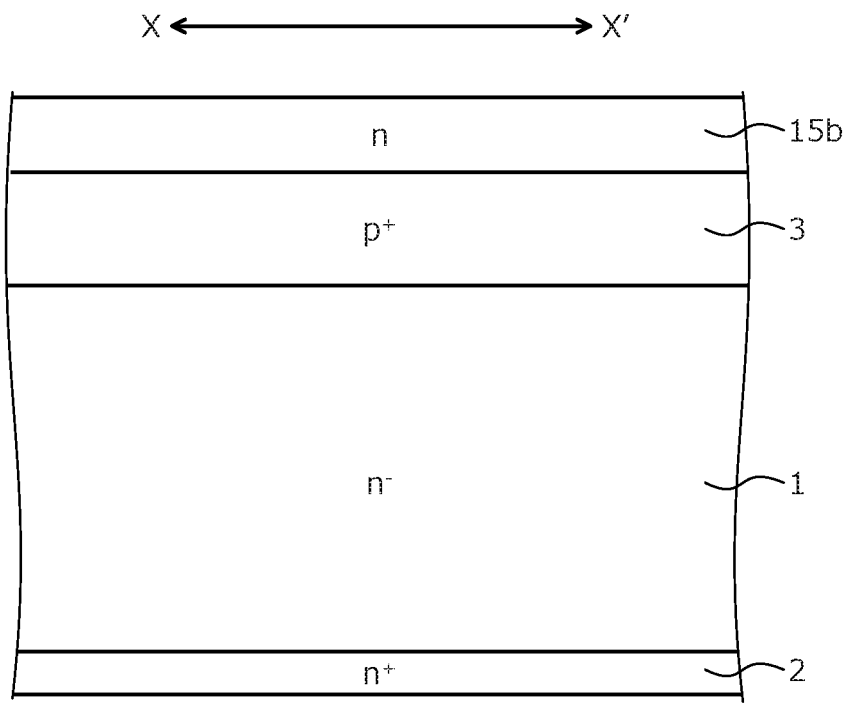
FIG. 10A is a cross-sectional view of the silicon carbide semiconductor device according to the second embodiment, at cutting line X-X' in FIG. 8 during manufacture.
Figure 10B:
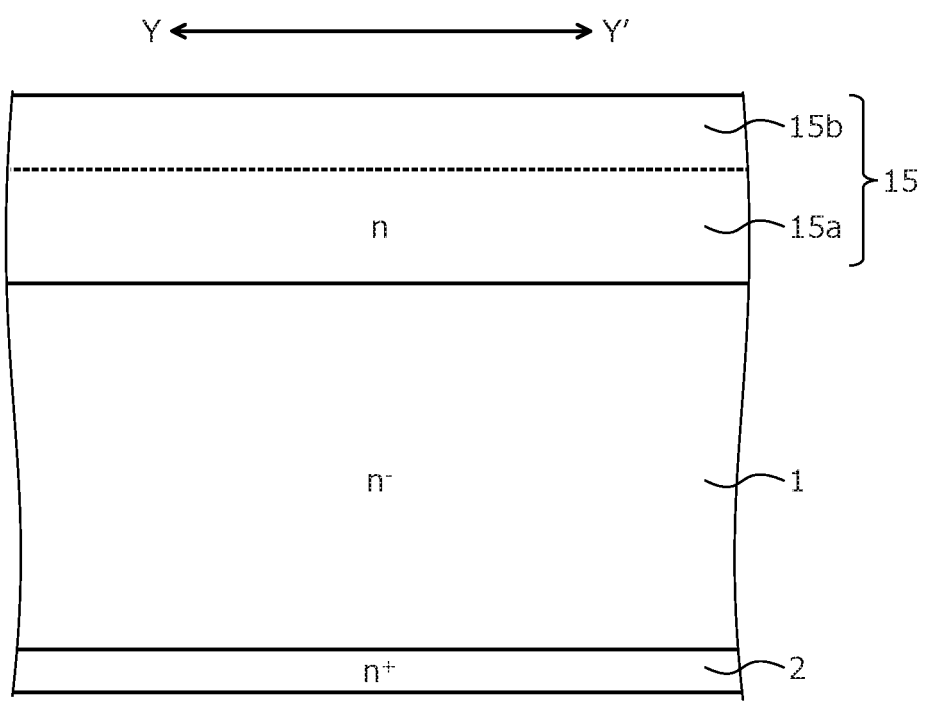
FIG. 10B is a cross-sectional view of the silicon carbide semiconductor device according to the second embodiment, at cutting line Y-Y' in FIG. 8 during manufacture.
Figure 10C:
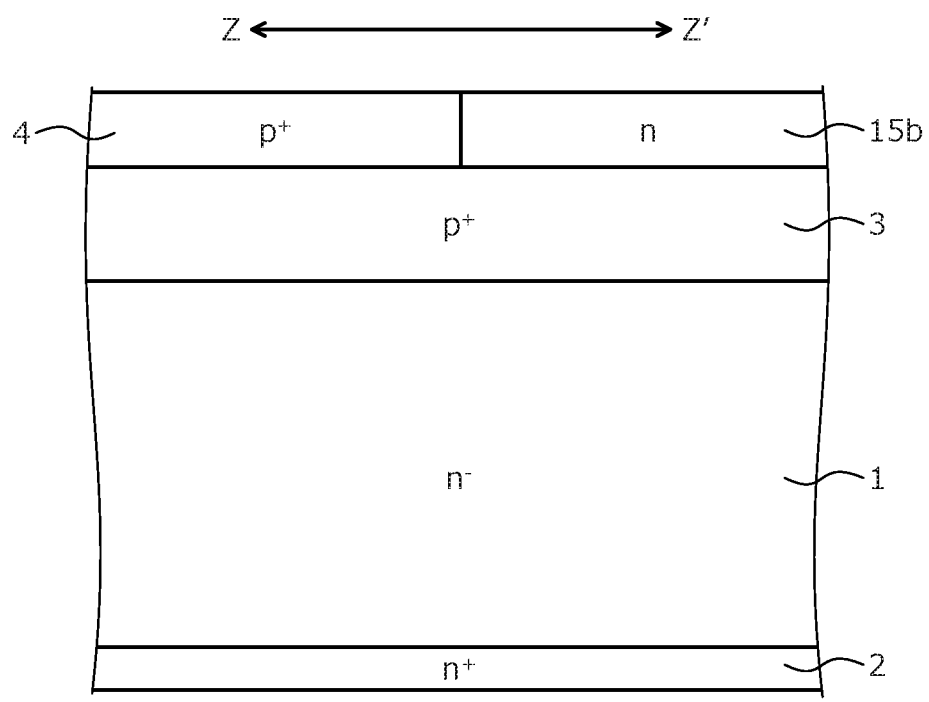
FIG. 10C is a cross-sectional view of the silicon carbide semiconductor device according to the second embodiment, at cutting line Z-Z' in FIG. 8 during manufacture.

Next, by photolithography and ion implantation of a p-type impurity, for example, Al, the second p$^+$-type region 4 is selectively formed in the surface layer of the upper n-type region 15b. For example, a dose amount at the time of ion implantation for forming the second p$^+$-type region 4 may be set so that the impurity concentration of the second p$^+$-type region 4 is in a range from $1\times10^{17}$ to $1\times10^{19}/cm^3$, the depth of the second p$^+$-type region 4 is in a range from 0.1 μm to 1.0 μm, and the width of the second p$^+$-type region 4 is in a range from 0.5 μm to 2.0 μm. The state up to here is depicted in FIGS. 10A to 10C. FIG. 10A is a cross-sectional view at cutting line X-X' in FIG. 8; FIG. 10B is a cross-sectional view at cutting line Y-Y' in FIG. 8; and FIG. 10C is a cross-sectional view at cutting line Z-Z' in FIG. 8.

Thereafter, similarly in the first embodiment, the process of forming the p-type base layer 16 by epitaxial growth and subsequent processes are sequentially performed, whereby the MOSFET depicted in FIGS. 7A to 7C is completed.

As described, according to the second embodiment, effects similar to those of the first embodiment may be obtained. Further, in the second embodiment, the first p$^+$-type region is provided in a striped shape along the width direction of the trenches. As a result, alignment deviations of the first p$^+$-type region and the trenches may be prevented. Therefore, since there is no need to form the first p$^+$-type region excessively large for alignment, the cell pitch of the semiconductor device may be reduced.

Figure 11:
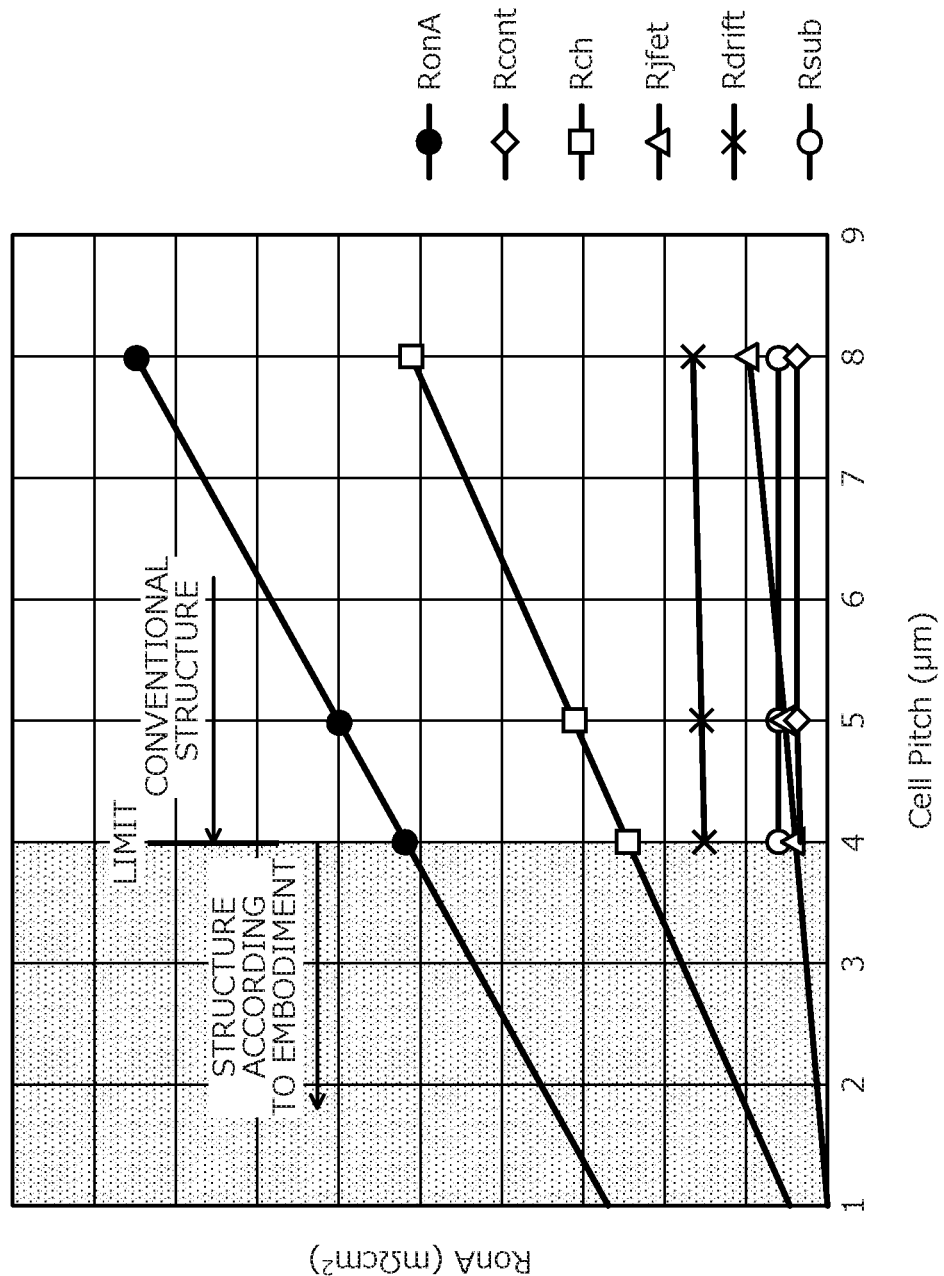
FIG. 11 is a graph depicting a relationship of cell pitch and ON resistance of the silicon carbide semiconductor device according to the first to the fourth embodiments.

FIG. 11 is a graph depicting a relationship of cell pitch and ON resistance of the silicon carbide semiconductor device according to the first and the second embodiments. FIG. 11 depicts results of simulation where a thickness of the n$^+$-type silicon carbide substrate 2 is assumed to be 150 μm, a drain current density Jc is assumed to be 300 A/cm$^2$, and forward voltage Vth is assumed to be 5V. A horizontal axis represents the cell pitch of the silicon carbide semiconductor device in units of μm, while a vertical axis represents ON resistance (RonA) per unit active area in units of mΩcm$^2$. According to FIG. 11, for cell pitches of 4 μm or greater, which may be realized by a conventional technique and for cell pitches less than 4 μm, which may be realized by the present invention, the ON resistance decreases as the cell pitch decreases. The present invention enables a silicon carbide semiconductor device having a cell pitch of less than 4 μm to be provided and thus, may provide a silicon carbide semiconductor device having a lower ON resistance.

In the embodiments of the present invention, various modifications within a range not deviating from the spirit of the invention are possible. For example, in the embodiments, dimensions, impurity concentrations, etc. of regions may be variously changed according to required specifications. Further, while a MOSFET has been described as an example in the embodiments, without limitation hereto, wide application to various types of silicon carbide semiconductor devices that conduct and interrupt current by gate driving control based on a predetermined gate threshold voltage is possible. For example, an insulated gate bipolar transistor (IGBT), etc. may be given as a silicon carbide semiconductor device under gate driving control. In the embodiments, while description has been given taking, as an example, a case where silicon carbide is used as a wide bandgap semiconductor material, application to another wide bandgap semiconductor material other than silicon carbide such as, for example, gallium nitride (GaN) is possible. Further, in the embodiments, while a first conductivity type is assumed to be an n-type and a second conductivity type is assumed to be a p-type, the invention is similarly implemented when the first conductivity type is a p-type and the second conductivity type is an n-type.

According to the embodiments, the gate electrode, the interlayer insulating film, and the barrier metal are embedded in the trench. As a result, the thickness of the interlayer insulating film may be adjusted by the length of the trench and even when the cell pitch is reduced, insulation of the gate electrode and the source electrode may be ensured. Therefore, decreases in semiconductor device yield due to degradation of insulation between the gate electrode and the source electrode may be resolved. Further, since the surface of the semiconductor base is flat, plating is facilitated and nickel silicide coverage also improves. Further, the mathematical area of contact between the first n$^+$-type source region (first semiconductor region of the first semiconductor type) and the nickel silicide increases and the contact resistance decreases. Therefore, even when the cell pitch is 4.0 μm or less, for example, 1.5 μm, the ON resistance does not increase and there is no need to use a tungsten plug.

Further, in the first embodiment, as the source region, the first n$^+$-type source region and the second n$^+$-type source region are provided and formed by ion implanting P or As in the first n$^+$-type source region, and implanting N$_2$ in the second n$^+$-type source region. As a result, the source region may be provided deeply, and the length of the trench may be increased. Therefore, the gate electrode, the interlayer insulating film, and the barrier metal may be embedded in the trench.

The semiconductor device and the method of manufacturing a semiconductor device according to the embodiments of the invention achieve an effect in that without increases in the ON resistance, the cell pitch may be made less than 4.0 μm and the reliability is high.

As described, the semiconductor device and the method of manufacturing a semiconductor device according to the embodiments of the present invention are useful for power semiconductor devices used in power converting equipment and power supply devices such as in various types of industrial machines, and are particularly suitable for silicon carbide semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate of a first semiconductor type;
   a first semiconductor layer of the first semiconductor type provided on a front surface of the semiconductor substrate;
   a second semiconductor layer of a second semiconductor type provided on a first side of the first semiconductor layer opposite a second side of the first semiconductor layer, the second side facing toward the semiconductor substrate;
   a first semiconductor region of the first semiconductor type that is selectively provided in the second semiconductor layer, that is constituted by an upper first semiconductor region and a lower first semiconductor region in which the upper first semiconductor region has a width that is wider than that of the lower first semiconductor region, and that has an impurity concentration that is higher than that of the semiconductor substrate;
   a trench having a length that penetrates the first semiconductor region and the second semiconductor layer, and reaches the first semiconductor layer;
   a gate insulating film provided in the trench;
   a gate electrode provided in the trench on the gate insulating film;
   an interlayer insulating film that is provided only in the trench to cover the gate electrode, that is formed of SiO$_2$, and that has a thickness that is adjusted based on the length of the trench;
   a barrier metal layer containing Ti and selectively provided only in the trench and disposed on and in direct contact with the interlayer insulating film so as to substantially completely cover the interlayer insulating film;
   a first electrode that is flat and completely covers the semiconductor substrate, that is constituted by a Ni film provided on the semiconductor substrate and a Ti film provided on the Ni film, and that contacts the first semiconductor region, the second semiconductor layer, and the barrier metal layer;

a source electrode pad containing Al—Si provided on the first electrode; and a second electrode provided at a rear surface of the semiconductor substrate, wherein the semiconductor device has a cell pitch of less than 4.0μm so that ON resistance decreases as cell pitch decreases.

2. The semiconductor device according to claim 1, wherein the upper first semiconductor region and the lower first semiconductor region have differing impurity concentrations determining conductivity.

3. The semiconductor device according to claim 1, wherein the interlayer insulating film has a thickness of at least 0.3 μm.

4. The semiconductor device according to claim 1, further comprising a second semiconductor region of the second semiconductor type selectively provided in the first semiconductor layer, the second semiconductor region being in contact with a bottom of the trench.

5. The semiconductor device according to claim 4, wherein the trench has a width direction and the second semiconductor region has a striped shape parallel to the width direction of the trench.

6. The semiconductor device according to claim 2, wherein the upper first semiconductor region has an impurity concentration that ranges from $1\times10^{18}$ to $1\times10^{20}/cm^3$, and wherein the lower first semiconductor region has an impurity concentration that ranges from $1\times10^{17}$ to $1\times10^{19}/cm^3$.

7. The semiconductor device according to claim 1, further comprising a contact region of the second conductivity type selectively provided in the second semiconductor layer and in direct contact with the upper first semiconductor region but not in direct contact with the lower first semiconductor region, wherein the contact region has an impurity concentration that is higher than that of the second semiconductor layer.

* * * * *